United States Patent
Schroder

(10) Patent No.: US 7,468,557 B2
(45) Date of Patent: Dec. 23, 2008

(54) METHOD OF PRODUCING AN ULTRA THIN ELECTRICALLY CONDUCTING FILM WITH VERY LOW ELECTRICAL RESISTANCE

(75) Inventor: Klaus Schroder, East Syracuse, NY (US)

(73) Assignee: Syracuse University, Syracuse, NY (US)

( * ) Notice: Subject to any disclaimer, the term of this patent is extended or adjusted under 35 U.S.C. 154(b) by 112 days.

(21) Appl. No.: 10/659,187

(22) Filed: Sep. 10, 2003

(65) Prior Publication Data

US 2004/0104480 A1 Jun. 3, 2004

Related U.S. Application Data

(60) Provisional application No. 60/410,041, filed on Sep. 11, 2002.

(51) Int. Cl.
*H01L 23/48* (2006.01)
(52) U.S. Cl. .................................................. 257/757
(58) Field of Classification Search ................. 438/656, 438/582; 257/757
See application file for complete search history.

(56) References Cited

U.S. PATENT DOCUMENTS

| 5,584,941 | A  | * | 12/1996 | Nishida | ....................... 136/258 |
| 6,172,296 | B1 | * | 1/2001 | Iwasaki et al. | ............... 136/256 |
| 6,507,187 | B1 | * | 1/2003 | Olivas et al. | ........... 324/207.21 |
| 2003/0000930 | A1 | * | 1/2003 | Hamada | ................ 219/121.73 |

* cited by examiner

*Primary Examiner*—Keisha L Rose
(74) *Attorney, Agent, or Firm*—Christopher R. Pastel; Pastel Law Firm

(57) ABSTRACT

An ultra thin film with very low electrical resistance is produced by forming a substrate of a substrate material which forms a metastable bond and depositing a conducting film on the substrate in a vacuum environment in which a base pressure is reduced to a value below $10^{-5}$ Torr. The film is a metal, metallic alloy, or multilayered film which includes at least one metallic layer. A 0.1 nm thick manganese film deposited in this way on a germanium substrate has a resistivity which at room temperature is lower than the resistivity of metal films of aluminum and copper with the same thickness prepared the same way.

9 Claims, 1 Drawing Sheet

METHOD OF PRODUCING AN ULTRA THIN ELECTRICALLY CONDUCTING FILM WITH VERY LOW ELECTRICAL RESISTANCE

CROSS-REFERENCE TO RELATED APPLICATIONS

This application claims priority from U.S. Provisional Application Ser. No. 60/410,041 filed Sep. 11, 2002 and entitled METHOD OF PRODUCING AN ULTRA THIN MANGANESE FILM WITH VERY LOW ELECTRICAL RESISTANCE, incorporated herein by reference.

FIELD OF THE INVENTION

This invention relates generally to the field of the production of ultra thin electrically conducting films useful for metallic interconnects of semiconductor devices, and, more specifically, to the production of manganese based thin films in the sub 100 nm thickness range.

BACKGROUND OF THE INVENTION

As device geometry becomes smaller and smaller, interconnects used in devices become thinner and thinner. To obtain low resistance interconnects, metals such as aluminum and copper are used extensively because both metals have low resistivity values and low cost. These materials are usually deposited by sputtering processes. However, other methods, such as evaporation and CVD, are also used in particular applications.

One of the problems in reducing the size of devices, and especially the thickness of the conductors, is due to the fact that the resistivity of thin films increases with the decreasing thickness if the thickness approaches values below 20 nm. This is due to the fact that surface scattering of electrons begins to make a noticeable contribution to the resistivity. This contribution is in first approximation inversely proportional to the thickness of the film and is also a function of how many electrons are scattered inelastically at the surface. Another contribution to the resistance is due to geometric effects. Below 5 nm, metal films are usually not continuous, because the metal atoms tend to form islands. Conduction requires that electrons jump from one island to another, leading to high resistence values.

Chopra (Thin Film Phenomena, McGraw Hill, New York, N.Y. 1969, p357) published resistivity values of gold films as a function of thickness t. The resistivity was nearly constant for t>40 nm, but increased rapidly with decreasing t for t values below 25 nm. The Handbook of Thin Film Technology (L. I. Maissel and R. Gland, Edt., McGraw Hill, New York, N.Y. 1983, p 13-12) shows that the resistance of annealed gold films is nearly constant between 20 and 85 nm. There is an increase in the resistivity with decreasing thickness below t=20 nm. The lowest data points are given for t=4 nm.

I. M. Rycroft and B. L. Evans (Thin Solid Films 290-1, 1996, pp 283-288) measured the resistivity of Pt, Ni, Fe, Cu, and Ag samples. The iron film deposited on glass showed a continuous region for t>6 nm, a semi-continuos region for 2 nm<t<6 nm, and a discontinuous region for lower thickness values. The resistance/square was about $10^8$ Ohm/square for the 1 nm thick film, at t=2 nm the resistance/square was close to $10^6$ Ohm/square, and at t=6 nm the resistance/square was about $10^3$ Ohm/square. The transition from the semi-continuous region to the continuous region occurred for six of the samples between 2.3 nm and 5.1 nm, while two others showed values of 7.5 nm and 22 nm.

R. Schadt, S. Heun, T. Heidenblut and M. Henzler (Phys. Rev. B45, pp 11430, 1992) studied thin epitaxial Ag films on Si(111) surfaces at very low temperatures. The Si-substrate was subjected to a complicated cleaning and annealing process to produce atomically clean and smooth surfaces. Films thicker than 2 monolayers behaved metallically. Resistivities were measured at 20 K. The resistivity of the 1-monolayer thick film (t=0.2 nm) was about 0.01 Ohm·m, while for the 5-monolayer thick film (t=1 nm) the resistivity was about 10-4 Ohm·m.

Very low resistance values for thin metal films deposited in a high vacuum on $MgF_2$ or polymers were found by Rasch and Cowden (U.S. Pat. No. 3,801,325). In one case a 6 nm thick Mn-film was deposited on a 5 nm thick $MgF_2$-film, which was then covered by another layer of $MgF_2$. The resistance/square was <$10^4$ Ohm. Their thinnest Al-films (2.2 nm thick) deposited on polyethylene terephthalate (PET) had a $MgF_2$ overlayer. The film had a resistance of 200 Ohm/square. The patent disclosure deals only with the use of these films in photographic articles; the possible use in electronic devices or in any other application was not mentioned.

K. Schroder and Le Zhang (Phys. Stat. Sol. (b) 183, pp K5, 1994) determined that chromium films deposited on a germanium substrate showed very low resistivity values. The resistivity of the 0.3 nm thick film was $5\times10^{-6}$ Ohm·m, and the 1 nm thick film showed a resistivity of $10^{-6}$ Ohm·m. The results obtained for chromium films were regarded as unusual for metal films. Chromium films show unexpected magnetic and thermopower properties, which suggested that the films could be superconducting at the surface at room temperature (K. Schroder and S. Najak, Phys. Stat. Sol. (b) 172, pp. 679, 1992. K. Schroder, Le Zhang, and W.-T Ger, Phys. Stat. Sol. (b) 181, pp. 421, 1994). This was predicted in the exciton theory proposed by Bardeen, who showed theoretically that the transition temperature from superconductivity to normal behavior can be very high at the interface of a superconductor and a semiconductor.

In U.S. Pat. No. 6,406,997 (Schroder), it was disclosed that chromium overlayers on conductors should reduce failure by electromigration, because the interface resistance between the chromium overlayer and a conductor can be lower than the surface resistance of the conductor without an overlayer. It was argued that a low electrical interface resistance was due to low inelastic surface scattering of electrons, and inelastic surface scattering was responsible for electromigration, and that Ge-overlayers on Cr-films also reduce the resistance.

In U.S. Pat. No. 3,801,325 Rasch and Cowden show that the resistance of a 2.5 nm thick silver film deposited on polyethylene terephthalate (PET) decreased from a resistance of 28 Ohm/square to a resistance of 25 Ohm/square if a 5 nm thick $MgF_2$ overlayer was deposited on the Ag-film. This overlayer should not affect the resistance of the silver film because $MgF_2$ is an insulator. Therefore one has again to assume that the interface between $MgF_2$ and the silver film has a lower resistance than the surface of the silver film without an overlayer, and with it lower inelastic scattering. This reduction in resistance should lead to a reduction in the failure rate due to electromigration.

SUMMARY OF THE INVENTION

Briefly stated, an ultra thin film with very low electrical resistance is produced by forming a substrate of a material which forms a metastable bond and depositing a conducting film on the substrate in a vacuum environment in which a base pressure is reduced to a value below $10^{-5}$ Torr. The film is a metal, metallic alloy, or multilayered film which includes at least one metallic layer. A 0.1 nm thick manganese film deposited in this way on a germanium substrate has a resistivity which at room temperature is lower than the resistivity of metal films of aluminum and copper with the same thickness prepared the same way.

According to an embodiment of the invention, an apparatus includes a substrate; an electrically conducting film deposited on the substrate, wherein the film is a metal other than Cr or Cr-alloys when said substrate is Ge or Si, or the film is a metallic alloy, or a multilayered film which includes at least one metallic layer; wherein the substrate consists essentially of a substrate material which forms a bond with the film; and wherein the deposition is in at least a high vacuum environment.

A method for producing an electrically conducting ultra thin film with very low electrical resistance includes the steps of forming a substrate in at least a high vacuum environment wherein the substrate consists essentially of a substrate material which forms a bond with the film; and depositing the film on the substrate in the at least a high vacuum environment without breaking vacuum between steps; wherein the film is a metal other than Cr or Cr-alloys when said substrate is Ge or Si, or the film is a metallic alloy, or a multilayered film which includes at least one metallic layer.

According to an embodiment of the invention, a method of reducing electromigration in a conductive film includes the steps of preparing a sequence of at least one adjacent layer on a top, at a bottom, and/or at least one side of the conductive film in such a way that a total resistance at all interfaces between the conductive film and the at least one adjacent layer, and between pairs of any neighboring layers, is reduced to a lower level than otherwise exists between the conductive film and the at least one adjacent layer, and between pairs of any neighboring layers, thereby leading to reduced inelastic surface and interfacial electron scattering and with it to a reduction in electromigration; wherein the conductive film is selected from the group consisting of pure metals and metal alloys, excluding Cr and Cr-alloys when on a Ge or Si substrate; and wherein the at least one adjacent layer is selected from the group consisting of Ge, Si, As, B, Bi, C, Ga, Se, Te, Fe, Al, W, Mo, Ta, Nb, V, Hf, Zr, Re, semiconducting compounds, halides, and co-deposited mixtures of incompatible systems.

DETAILED DESCRIPTION OF THE PREFERRED EMBODIMENT

Figure 1:
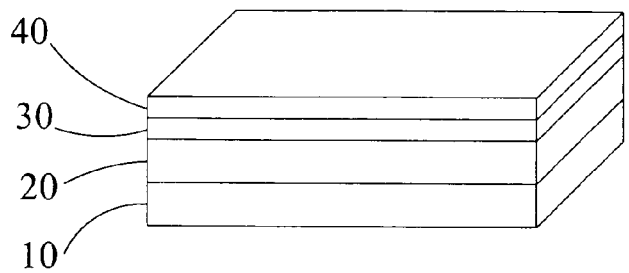
FIG. 1 shows an embodiment of the present invention which includes a manganese thin film on its substrate.

Referring to FIG. 1, a glass plate 10 is placed into a high vacuum, very high vacuum, or ultra high vacuum system in which the base pressure is preferably reduced to values below $10^{-7}$ Torr, but values below $10^{-5}$ Torr will also work. Higher pressures lead to lower quality films. The term "high vacuum" commonly refers to base pressures between $10^{-3}$ Torr and $10^{-6}$ Torr, "very high vacuum" commonly refers to base pressures between $10^{-6}$ Torr and $10^{-9}$ Torr, and "ultra high vacuum" commonly refers to base pressures below $10^{-9}$ Torr.

Then, preferably by evaporation, a germanium substrate 20 which is 0.2 to 2 nm thick is deposited on glass plate 10. Following this, without breaking the vacuum, a manganese film 30 is deposited on germanium substrate 20. The thickness of manganese film 30 depends on the required current carrying capacity, but even a 0.1 nm thick Mn-film will show metallic conduction. Manganese film 30 is optionally protected by a second germanium film 40, prepared as an overlayer on manganese film 30. This Ge-film 40 may also reduce the resistance of the manganese film. Other combinations of base pressure, and pressure during or after evaporation, should also lead to similar ultra thin, low resistance film.

Manganese is a metal with a very high room temperature resistivity. Values of about $1.5 \times 10^{-6}$ Ohm·m have been published for bulk material, which is a value nearly 100 times the value for copper or silver. Manganese is therefore not used for electrical conductors. During the inventive process for the present invention, it was found that if a manganese film is deposited in a vacuum system on a Ge-substrate, its resistance is very low. Similar results were obtained for silver and copper films. Data for manganese, silver, and copper deposited on glass plates with Ge-overlayers are shown below in Table 1. The first row gives the metallic film thickness t as determined with a thickness monitor, while the other rows give the resistivity obtained from the resistance/square, with resistivity equal to (resistance/square)·t. The vacuum was not broken during the interval between germanium deposition and the following metal deposition. The bottom row shows resistivity values for manganese deposited on glass under the same vacuum conditions. The resistivity was so large that it could not be measured for t<3.5 nm. Note the change in units for the row with Mn on glass.

TABLE 1

| Resistivity of metal films (present measurements) | | | | | | | | | |
|---|---|---|---|---|---|---|---|---|---|
| | | Resistivity at film thickness of (nm) | | | | | | | |
| Material | No. | 0.1 | 0.2 | 0.5 | 1 | 2 | 3 | 4 | 5 |
| Mn on Ge | 12-07 | 11.9 | 4 | 1.8 | 1.8 | 1.9 | 1.8 | 1.8 | 1.8 |
| Ag on Ge | 12-12 | | 38 | 2.5 | .4 | .14 | 0.1 | 0.08 | |
| Al on Ge | 12-18 | | | | 40 | 27 | 3.6 | | |
| Cu on Ge | 10-10 | 65 | 35 | 3.8 | 1.2 | | | | |
| Mn on glass | 9-12 | | | | | | | 16 | 3 |

Results are expressed in $10^{-6}$ Ω·m, except for Mn on glass, where results are expressed in $10^{-3}$ Ω·m. The resistivity of multilayers of metallic films on Ge substrates can also be very low. Our film in which the layers in sequence were Ge—Cr—Fe—Cr— had in the second Cr-layer a resistivity of about $3.5 \cdot 10^{-6}$ Ohm·m at the position where the total metallic thickness was 1 nm. Our Mn—Ag—Mn—Ag—Mn—Ag—Mn—Ag—Ge film deposited on Ge had a resistivity of $2.3 \times 10^{-6}$ Ohm·m for a film 1 nm thick, close to the interface between the second Ag-layer and the 3rd Mn-layer. These are values similar to those given in Table 1. for pure metallic films.

The data show that the resistivity of metallic films deposited on a freshly prepared Ge-substrate is lower than found for films prepared in glass. The lowest resistance values for films 0.1 nm thick are found for manganese. The resistivity of manganese prepared in these experiments is constant for films more than a 1 nm thick and is the same as for bulk manganese, which is an unexpected result. The low resistance of metallic films, including manganese films, deposited in a vacuum system on substrates with metastable bonds, such as amorphous germanium, makes them useful as interconnect material, especially since manganese and germanium films can be easily prepared in a very high vacuum system. The resistance of the manganese film at 0.2 nm thickness is even lower than found at 20 K for a 0.2 nm thick silver film prepared on a silicon single crystal.

The most likely explanation for the low resistance of the metallic films deposited in some of our experiments on Ge-substrate is that the Ge-substrate is amorphous. Some of the bonds between Ge-atoms which tie atoms together are therefore metastable. Metal atoms deposited on the Ge-surface chemically bond with the metastable amorphous germanium. Therefore they stick to the surface rather than diffusing over the Ge-surface until they connect with other metal atoms and form "islands." These islands are electrically disconnected, leading to the high resistance usually found in very thin films on glass plates.

This argument is supported by the observation that a short exposure of the Ge-film to air before the metal film is deposited leads to much higher resistance values than found for the same metal films deposited on the Ge-substrate not exposed to air. Exposure to air leads to chemical adsorption of oxygen and nitrogen atoms on the substrate, so that metastable bonds are now changed to regular bonds with the oxygen or nitrogen. It seems therefore reasonable to expect that not only semiconducting substrate films, but any non-metallic substrate film which has or can easily form metastable bonds, could be a substrate for a metallic film which will start its growth as a continuous film and not as unconnected islands. This would explain the findings of Rasch and Cowden that Al-, Bi- and Ag-films deposited under vacuum conditions on polyethylene terephthalate (PET) show low resistance values.

It is known that Ge and Si will form amorphous films below 150° C., while W, Mo, Ta, Nb, V, Hf, Zr, and Re will form amorphous films at 100° C., while Al, As, B, Bi, C, Fe, Ga, Se, and Te will form amorphous films at or below room temperature by sputtering or evaporation. Many semiconducting compounds, halides, and codeposited mixtures of incompatible systems will form amorphous films at about −180° C., i.e., near the temperature of liquid nitrogen. It is expected that metal films formed on these amorphous films would behave like Mo or the other metal films Ag, Cu, Cr, Fe which were prepared on Ge, i.e., they should show good metallic conductivity even if only a monolayer thick. It is also expected that all metals, including gold, would behave this way, as would metallic alloys.

Thus, the substrate of the present invention can be Ge, Si, As, B, Bi, C, Ga, Se, Te, Fe, Al, W, Mo, Ta, Nb, V, Hf, Zr, Re, semiconducting compounds, halides, and co-deposited mixtures of incompatible systems. The material of the thin film of the present invention deposited in very/ultra high vacuum on the substrate can be metallic alloys, multilayers containing several metallic films, and all metals, including Mn, Ag, Fe, Cu, Cr, Mn, Ag, Fe, Al, Au, Ni, Pd, Pt, Co, and their alloys, although the use of Cr and Cr-alloys on Ge and Si substrates is known in the art.

Manganese films on a Ge-substrate showed a decrease of their resistances when a Ge-overlayer was deposited on the Mn-film. Germanium has a very high resistivity at room temperature. If one assumes that a current flows parallel to the Ge-Mn interface of a system in which the Mn-film and the Ge-film have about the same thickness, the resistance change due to the germanium deposition would be less than 0.1%. In contrast, however, the resistance decrease observed has values of up to 10% as shown in Table 2.

TABLE 2

Resistance decrease in Mn-films due to Ge-overlayers

| | Sample | | | | |
|---|---|---|---|---|---|
| | 12-6 | 10-16 | 10-16 | 12-5 | 12-5 |
| Thickness Mn Film (nm) | 2.0 | 1.9 | 1.9 | 2.2 | 2.2 |
| Thickness of Ge-overlayer (nm) | 0.4 | 0.8 | 0.35 | 0.25 | 0.6 |
| Relative resistance change | −3.7% | −10% | −3.5% | −4% | −8.5% |

Figure 2:
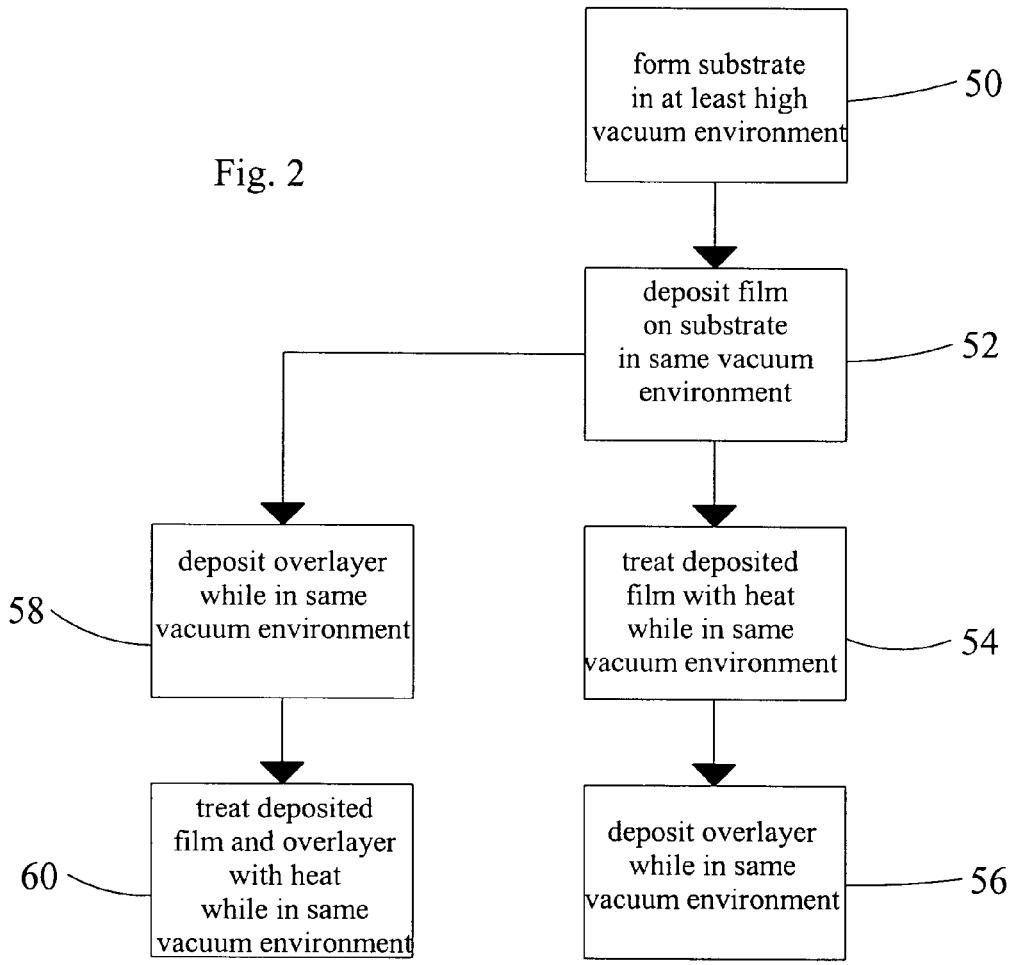
FIG. 2 shows a process according to an embodiment of the invention which produces the embodiment of FIG. 1.

The process steps are shown in FIG. 2. In step 50, the substrate is formed in at least a high vacuum environment. Next, the electrically conducting film is deposited in step 52 in the same vacuum environment, i.e., without breaking the vacuum between the steps. The deposited film is then optionally heat treated in step 54 in the same vacuum environment. The overlayer is deposited in the same vacuum environment in step 56, either instead of the heat treatment or after the heat treatment. In a variation, the overlayer is deposited in step 58 before the deposited electrically conducting film and overlayer together are heat treated in step 60.

Since low resistivity values imply that the fraction of electrons reflected inelastically at surfaces and interfaces is low, these low resistance films should also show low failure rates due to electromigration. More information on electromigration is contained in U.S. Pat. No. 6,406,997 (Schroder) issued Jun. 18, 2002 and entitled "Chromium Films and Chromium Film Overlayers", incorporated herein by reference.

Thin films can be prepared with different methods, like evaporation, sputtering, or by chemical deposition. In the present experiments, films were prepared by evaporation in at least a high vacuum system. The quality of these films depends on several parameters, including total pressure of the vacuum system, partial pressure of impurity gasses, deposition rate of different materials on the substrate on which the films are prepared, surface structure of the substrate (roughness etc.), and temperature of the substrate. Our experiments were done in a vacuum system which was baked out for several hours at temperatures between 200 and 350 degrees Celsius. This produced a base pressure in the $10^{-7}$ to $10^{-8}$ Torr range. Materials were heated in a coil made from W-wire 0.25 mm in diameter. This coil was heated by resistive heating with a current of 2 to 6 Amps, making it possible to melt Cr. The pressure during evaporation reached values of $10^{-5}$ Torr to $10^{-6}$ Torr and then returned to the $10^{-7}$ Torr or lower range. The heating current for the coil was selected in such a way that the deposition rate of the metals and the semiconducting materials were in the 0.1 nm/min. range. This rate was selected because it made it easy to record the resistance data. The substrate was sometimes heated up to 200 degrees Centigrade, or cooled with liquid nitrogen. The very low resistance values found in these films shows that they should be of high quality. In other words, they should not have excessive numbers of holes, very large holes nor other geometric defects such as cracks. It is expected that other combinations of pressure, substrate temperature, and evaporation rate would lead to similar or even lower resistance films.

Heat treatments are usually processes in which a sample is heated for a specified time to change its properties. Typical examples may be a hard drawn wire of a pure metal which during a heat treatment mechanically softens and has a lower electrical resistance because line defects such as dislocations are partially eliminated or changed into a different configuration, or point defects such as vacancies are reduced in number. Alloys, multiphase structures, and compounds may undergo phase transformations. Steels and Al-alloys are common examples in which such heat treatments lead to mechanical and electrical changes. Quenching is also part of a heat treatment, which can be done by quenching to temperatures below room temperature.

Heat treatments of a multilayer film can give rise to diffusion of the atoms from one layer to the adjacent layer. New crystalline phases may form, possibly improving films mechanically or electrically, even magnetically, but also possibly leading to film deterioration. Cooling to lower temperatures could also lead to changes in the structure of films. This would be rare, and would be expected only in materials which have different stable phases at lower temperatures than at the temperature were the film was formed. Such transformations could be beneficial for mechanical, magnetic, or electrical properties of the films.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. An apparatus, comprising:
   a non-metallic substrate;
   an electrically conducting film deposited on said substrate, wherein said film is a metal other than Cr, or said film is a metallic alloy other than Cr-alloy when said substrate is Ge or Si, or said film is a multilayered film which includes at least one metallic layer;
   wherein said apparatus does not contain a p-n junction or a pin junction;
   wherein a juncture of said film and said substrate forms a plane;
   wherein a current flow within said film is substantially parallel to said plane; and
   wherein said substrate consists essentially of a substrate material having metastable bonds on its surface immediately before deposition of said film, which forms a bond with said film.

2. An apparatus according to claim 1, wherein said substrate material is selected from the group consisting of non-metallic elements, non-metallic alloys, and non-metallic compounds, semiconducting compounds, halides, and co-deposited mixtures of incompatible systems.

3. An apparatus according to claim 2, wherein said film is a material selected from the group consisting of Mn, Ag, Fe, and Cu.

4. An apparatus according to claim 2, wherein said film is a material selected from the group consisting of Mn, Ag, Fe, Al, Au, Ni, Pd, Pt, Co, and their alloys.

5. An apparatus according to claim 2, further comprising an overlayer on said conducting film, wherein said overlayer is selected from the group consisting of Ge, Si, As, B, Bi, C, Ga, Se, Te, Fe, Al, W, Mo, Ta, Nb, V, Hf, Zr, Re, semiconducting compounds, halides, and co-deposited mixtures of incompatible systems.

6. An apparatus according to claim 1, wherein said film is a material selected from the group consisting of Mn, Ag, Fe, and Cu.

7. An apparatus according to claim 1, wherein said film is a material selected from the group consisting of Mn, Ag, Fe, Al, Au, Ni, Pd, Pt, Co, and their alloys.

8. An apparatus according to claim 1, wherein said film is less than about 0.2 nm thick and has an electrical resistance of less than $4 \times 10^{-6}$ Ohm·m.

9. An apparatus according to claim 6, in which said substrate is less than 5 nm thick.

* * * * *